(12) United States Patent
Melanson

(10) Patent No.: US 7,193,546 B1
(45) Date of Patent: Mar. 20, 2007

(54) PHASE-MEASURING DELTA-SIGMA MODULATOR CALIBRATION METHOD AND APPARATUS

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/312,818

(22) Filed: Dec. 20, 2005

(51) Int. Cl.
*H03M 3/00* (2006.01)

(52) U.S. Cl. .................. 341/143; 341/118; 341/120

(58) Field of Classification Search ........... 341/143, 341/118, 120
See application file for complete search history.

(56) References Cited

U.S. PATENT DOCUMENTS

| | | | | |
|---|---|---|---|---|
| 4,321,706 A | * | 3/1982 | Craft | 375/295 |
| 5,369,404 A | * | 11/1994 | Galton | 341/143 |
| 5,786,951 A | | 7/1998 | Welland et al. | |
| 5,903,857 A | * | 5/1999 | Behrens et al. | 702/190 |
| 6,111,529 A | | 8/2000 | Maulik et al. | |
| 6,313,961 B1 | | 11/2001 | Armstrong et al. | |
| 6,373,418 B1 | * | 4/2002 | Abbey | 341/143 |
| 6,407,689 B1 | * | 6/2002 | Bazarjani et al. | 341/143 |
| 6,738,003 B2 | | 5/2004 | Melanson | |
| 6,756,927 B2 | * | 6/2004 | Hammes et al. | 341/143 |
| 6,897,796 B2 | * | 5/2005 | Dias et al. | 341/143 |
| 7,009,540 B1 | * | 3/2006 | Chen et al. | 341/143 |
| 2004/0036639 A1 | * | 2/2004 | Hammes et al. | 341/143 |

* cited by examiner

*Primary Examiner*—Linh Nguyen
(74) *Attorney, Agent, or Firm*—Andrew M. Harris; Mitch Harris, Atty at Law, LLC

(57) ABSTRACT

A phase-measuring delta-sigma modulator calibration method and apparatus provides for adjustment of the modulator noise transfer function (NTF) of the modulator in operational environments. A signal is injected into the feedback loop of the delta-sigma modulator either before or after the quantizer and the phase of the noise transfer function is measured by phase comparing the injected signal and quantizer output, which is first filtered with a narrow-band filter to remove other quantization noise or signal components. The delta-sigma modulator has adjustable coefficients that are adjusted in conformity with the phase-measurement to achieve a more desirable noise transfer function. Quadrature detection may be employed, with filtering provided by digital filters already present in an ADC converter for output filtering, or accumulators may be included to perform the phase accumulation. The signal generation and phase measurement may be at the zero of the NTF.

20 Claims, 5 Drawing Sheets

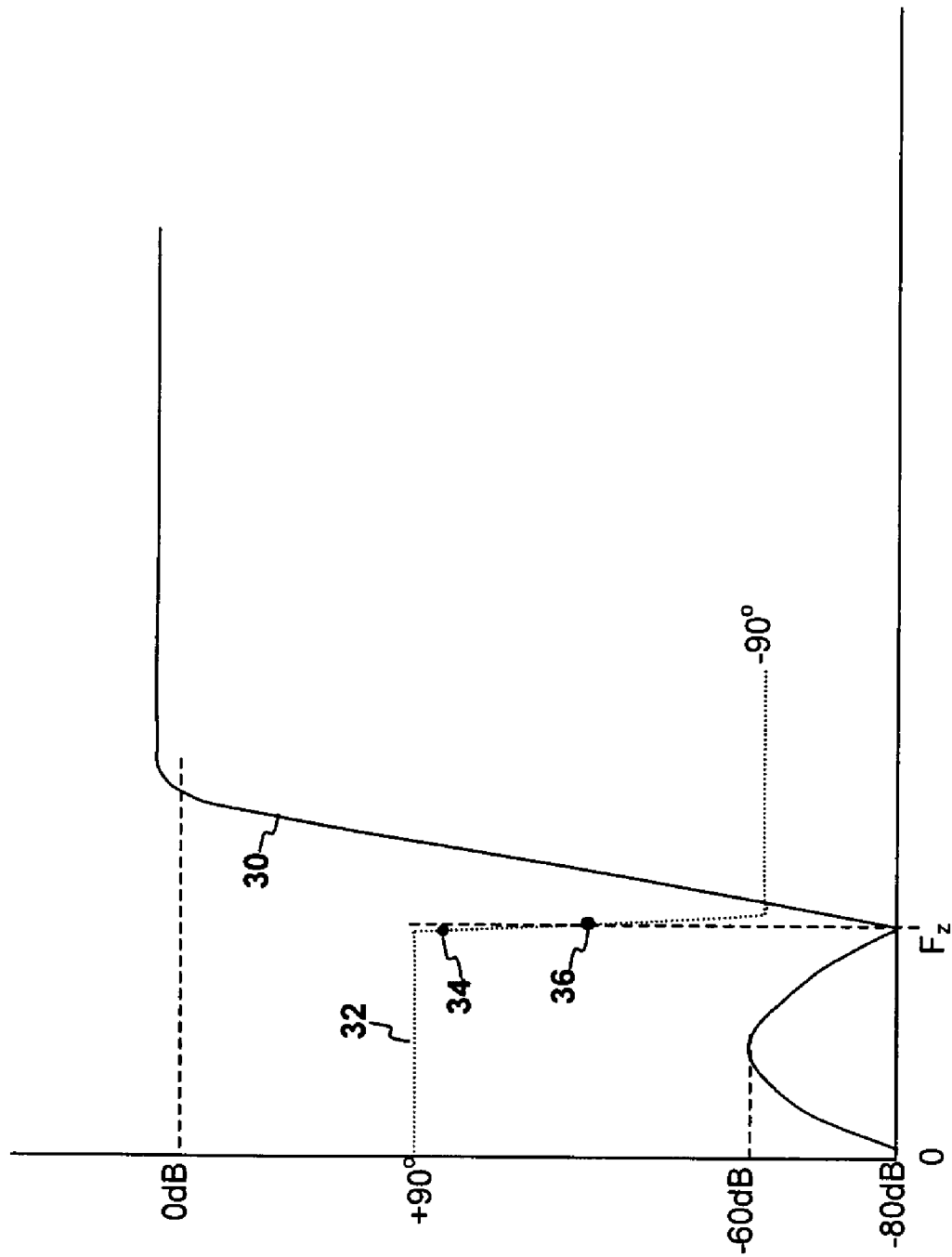

PHASE-MEASURING DELTA-SIGMA MODULATOR CALIBRATION METHOD AND APPARATUS

CROSS-REFERENCE TO RELATED APPLICATIONS

The following U.S. patent application is related to co-pending U.S. patent application Ser. No. 11/312,842, filed concurrently with this application by the same inventor, assigned to the same Assignee and entitled "DELTA-SIGMA MODULATOR COEFFICIENT CALIBRATION METHOD AND APPARATUS", the specification of which is incorporated herein by reference.

BACKGROUND OF THE INVENTION

1. Field of the Invention

The present invention relates generally to delta-sigma modulators/converters, and more specifically, to calibration of a delta-sigma modulator to adjust the modulator's noise transfer function.

2. Background of the Invention

Delta-sigma modulators are in widespread use in analog-to-digital converters (ADCs) and digital-to-analog converters (DACs), in which they provide very linear behavior and simple implementation due to the reduced number of bits used in the analog signal comparison. Delta-sigma modulators can be implemented with a high level of control of the frequency distribution of "quantization noise", which is the difference between the ideal output value of the modulator as determined by the input signal and the actual output of the modulator provided by a quantizer. Feedback applied from the output of the quantizer through the loop filter of the converter continuously attempts to force the quantization error of the modulator to zero. The "quantization noise" is the AC result of this process (i.e., the components of the quantization error having a frequency greater than zero).

The frequency distribution of the above-described "quantization noise" can be modeled as a noise transfer function (NTF) response to a unit white noise source, although in actuality the source of the "quantization noise" is not noise, and the NTF is somewhat signal-dependent as well as being inherently dependent on the order of the delta-sigma converter and the converter coefficients.

The NTF can be adjusted advantageously to a desirable shape by the design of the loop filter, including the selection of feedback coefficients applied to the various stages of the loop filter from the output of the quantizer. For example, in most ADC and DAC applications, the NTF is shaped to shift the energy of the quantization noise to a high frequency, typically at least twice the sample frequency, so that a subsequent digital filter can be applied to remove the quantization noise without aliasing the quantization noise back to the frequency band of interest. Very sophisticated design techniques including high-order loop filters can be employed to tune the NTF to achieve very high linearity and low actual quantization error after filtering.

However, in continuous-time loop filter delta-sigma modulators, the tuning of the loop filter is dependent on circuit parameters, such as resistor and capacitor values for traditional analog integrators, or capacitor ratios in switched-capacitor implementations. In such applications, the NTF can vary substantially from device to device and over temperature, in large part due to the gains of internal stages of the loop filter, which alter the integrator constants.

Therefore, it would be desirable to provide a calibration method and apparatus for delta-sigma modulation in which the noise transfer function can be measured and the noise transfer function response adjusted. It would further be desirable to provide such a method and apparatus that can perform such measurements and adjustments in a mode of operation as close to actual operation as possible.

SUMMARY OF THE INVENTION

The above stated objectives are achieved in a method and apparatus for calibration in a delta-sigma modulator. The method is a method of operation of the apparatus.

The apparatus includes a delta-sigma modulator having at least one adjustable coefficient and a signal generator for injecting a signal into the feedback loop of the delta-sigma modulator, either before or after the quantizer. The apparatus also includes a phase detector for determining a phase response of the delta-sigma modulator to the signal generator and may include a narrowband filter for removing components of the output of the delta-sigma modulator other than those due to the signal generator. The apparatus further includes a circuit for adjusting the adjustable coefficient in conformity with the detected phase response to tune the noise transfer function of the modulator.

The phase detector may be a quadrature detector that uses the low-pass output filters already present in a dual-channel ADC, or simple accumulators can be employed to accumulate phase error. The signal generator frequency may be the desired NTF zero frequency and the adjustable coefficient adjusted until the sign of the detected phase changes.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

FIG. 4 is a frequency response diagram illustrating the application of the adjusting circuit 20 of FIG. 1.

DESCRIPTION OF ILLUSTRATIVE EMBODIMENT

The present invention encompasses a method and apparatus for calibrating a delta-sigma modulator. The method calibrates the modulator by measuring the phase response of the modulator to a signal injected into the modulator feedback loop and adjusting at least one coefficient of the modulator. The adjustment of the coefficient(s) of the modulator affects the placement of the zero of the noise transfer function of the modulator, and the signal generator frequency is generally a frequency substantially equal to the frequency of the NTF zero. The apparatus comprises a delta-sigma modulator with additional phase measuring and calibration control circuits, including an adjustable circuit or circuits within the modulator that are adjusted in conformity with a measured phase response to the injected signal.

Figure 1:
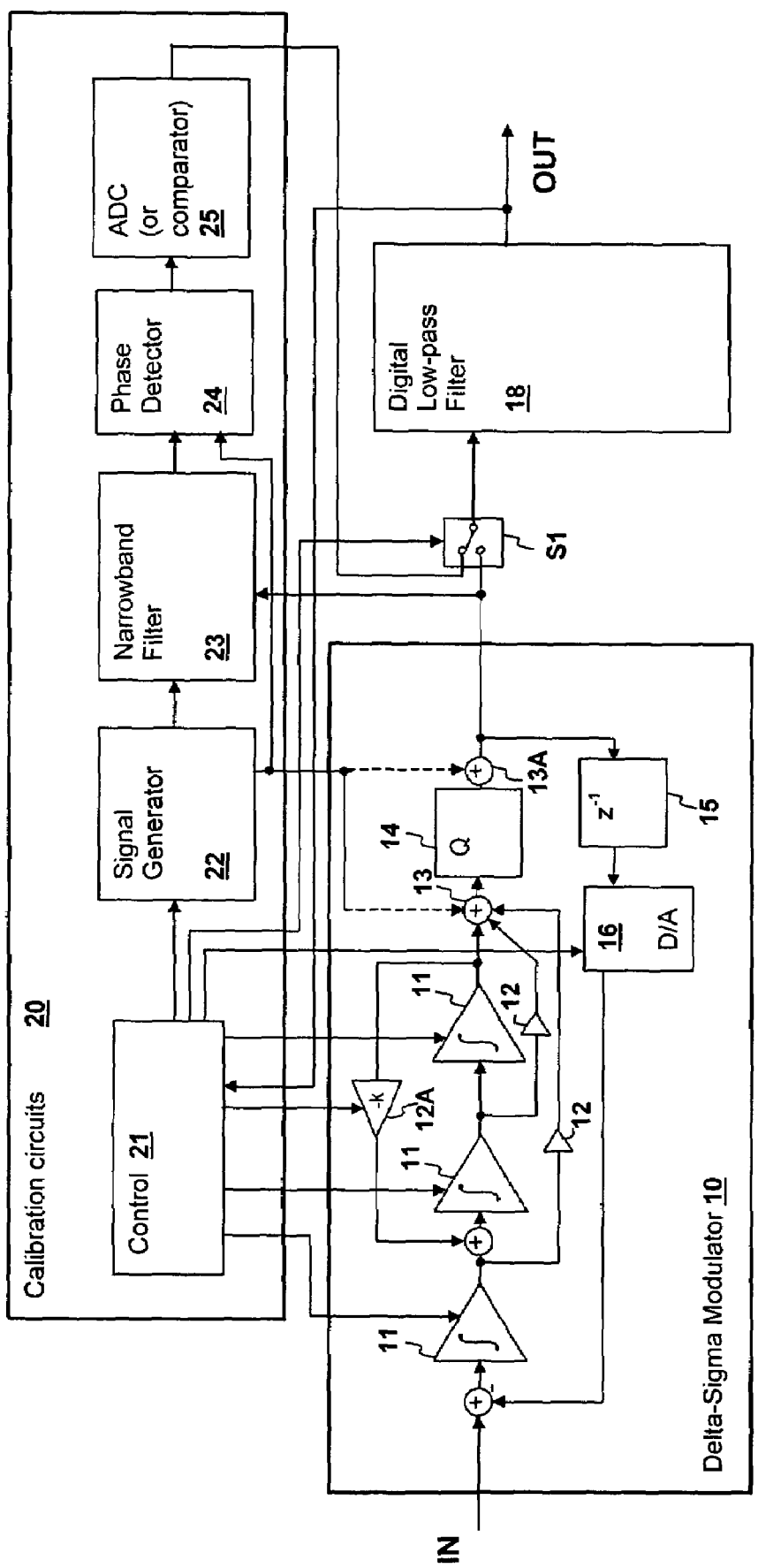
FIG. 1 is a block diagram depicting an apparatus in accordance with an embodiment of the present invention.

Referring now to FIG. 1, a circuit in accordance with an embodiment of the present invention is shown. A noise shaping delta-sigma modulator 10 has an input IN and provides a noise-shaped output from a quantizer 14. The output is applied to a digital low-pass filter 18, thereby providing a digital output OUT corresponding to the analog input IN. Thus, the depicted circuit forms an ADC. However, the techniques of the present invention apply to any noise-shaping delta-sigma modulator in which it is desirable to tune the modulator to improve the noise transfer function. The invention is especially applicable to continuous time analog loop filter type delta-sigma modulator, and in particular to those that are implemented with resistor-capacitor (RC) integrators, which typically have the largest process and temperature variations. The invention is also applicable to other analog loop delta-sigma modulators, such as those having switched-capacitor loop filters, providing further precision in the setting of the NTF response beyond the level of control provided by matched capacitor ratios in such implementations.

Delta-sigma modulator 10 implements a noise shaper using a series of integrator stages 11 that receive an input signal from the previous stage. The outputs of integrators 11 are scaled by scaling circuits 12 and are combined by a combiner 13, forming a third-order feed-forward loop filter. Combiner 13 may be a summing amplifier, and scaling circuits 12 may be resistors that set the gain of the summing amplifier with respect to the output of each integrator 11. Quantizer 14 receives the output of combiner 13 and provides feedback to the integrator stages via a delay 15 and a coarse DAC 16.

The integrator constants of each integrator 11 may be adjustable as shown. The adjustment is provided by one or more signals provided from a control circuit 21 within a set of calibration circuits 20. Control circuit 21 may also or alternatively set the gain of DAC 16 and/or the gain of an adjustable gain amplifier 12A that provides the local feedback around the second and third stages of the loop filter of delta-sigma modulator 10. The present invention provides a sensitive measurement technique that can detect the relative variation of the resistors and capacitors in a mixed-signal integrated circuit implementation of delta-sigma modulator 10. Resistor values typically track each other quite well from device to device and over operating conditions such as temperature, as do the values of capacitors. However, the capacitors and resistors do not generally track well, and the present invention provides a mechanism for tuning modulator 10 to overcome the variations. In switched-capacitor implementations, the present invention may provide further fine-tuning to adjust what little variation is present in the capacitance ratios.

The measurement of the present invention can provide fine tuning of the response of modulator 10 directly, can provide coarse and fine tuning, and can also used information provided by the measurement to tune circuits that do not affect the measured value by indicating the variations of values of resistors and capacitors with respect to each other. In one embodiment of the present invention, control circuit 21 positions the zero of the NTF via control of adjustable integrators 11 and/or adjustable gain amplifier 12A. However, for the sake of generality, control circuit 21 is shown adjusting each integrator 11, the gain of DAC 16 and the gain of adjustable gain amplifier 12A. In general, any control that adjusts the position of the NTF zero or otherwise adjusts the shape of the NTF in response to a measured phase of the feedback response of modulator 10 to an injected signal is contemplated by the present invention. The circuits of FIG. 1 are implemented within a single integrated circuit die, although that is not a requirement to practice the present invention.

Calibration circuits 20 also include a signal generator 22 that injects a test signal into the feedback loop of delta-sigma modulator 10 either by combination at the input to quantizer 14 via an input to combiner 13 or by introduction to an additional combiner 13A at the output of quantizer 14. The injected signal may be a sine wave, sine wave approximation, square wave or a noise shaped source. A sine wave approximation can be generated by a lookup table, which can be of very simple form if the test frequency is a sub-multiple of the sampling frequency. For the implementation depicted, a digitally generated signal would be more easily combined with the digital output of quantizer 14, while an analog signal would be more easily combined at the final analog combiner 13. However, the depicted embodiment is intended to illustrate the invention and will be understood to encompass other architectures with the appropriate addition of appropriate conversion between digital and analog domains as needed.

Because the signal generator output is injected into the quantizer, rather than the input of the delta-sigma modulator, the action of the modulator loop is to cancel the injected signal as quantization error (in this case artificially injected quantization error). Therefore, by direct comparison of the output of delta-sigma modulator 10 with the output of signal generator 22, it is possible to determine the response of the modulator to quantization noise, or in other words, measure the NTF.

In the present invention, phase measurements of the NTF response are used to calibrate the gain of delta-sigma modulator. In the depicted embodiment, a phase detector 24 is included in calibration circuits to compare the output of delta-sigma modulator 10 after filtering by a narrowband filter 23, with the output of signal generator 22. The output of phase detector 24 is converted to the digital domain, if not already in the digital domain, by ADC 25 and is then applied via switch S1 during a calibration mode, to digital low-pass filter 18. Alternatively, other filtering techniques may be used such as using an integrating (accumulating) phase detector 24. Control circuit 21 is responsive to the filtered output of phase detector 24 and uses the sign of the phase response of the NTF, or alternatively a magnitude and sign of the phase response of the NTF to adjust one or more coefficients of delta-sigma modulator 10 to achieve a desired NTF zero position via the above-described adjustable elements, or other adjustments that affect the position of the NTF zero.

Figure 2B:
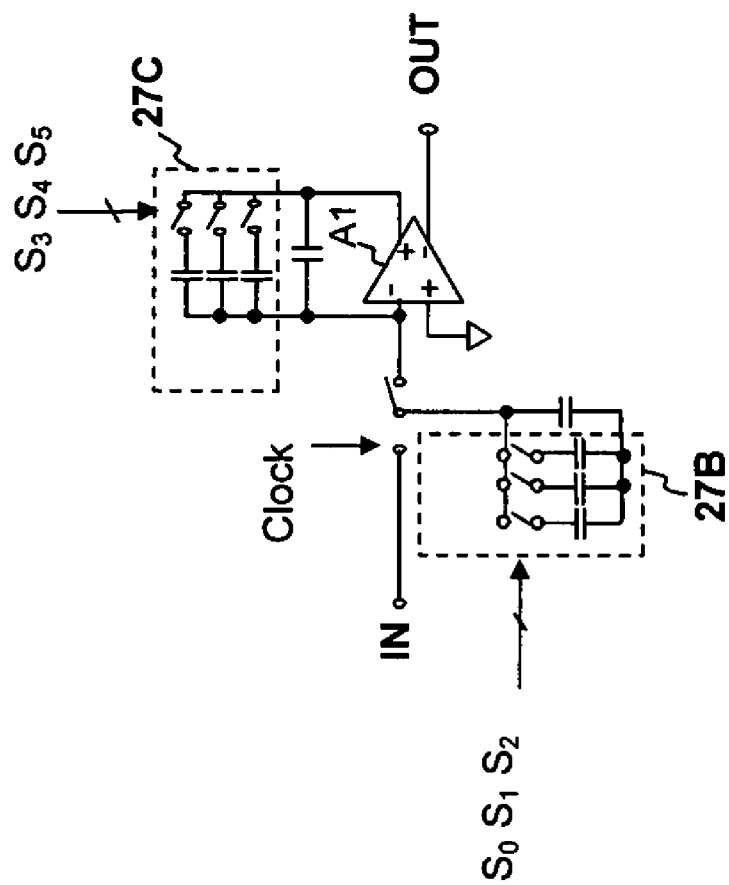
FIGS. 2A and 2B are schematic diagrams depicting embodiments of adjustable integrators 11 of FIG. 1.
Figure 2A:
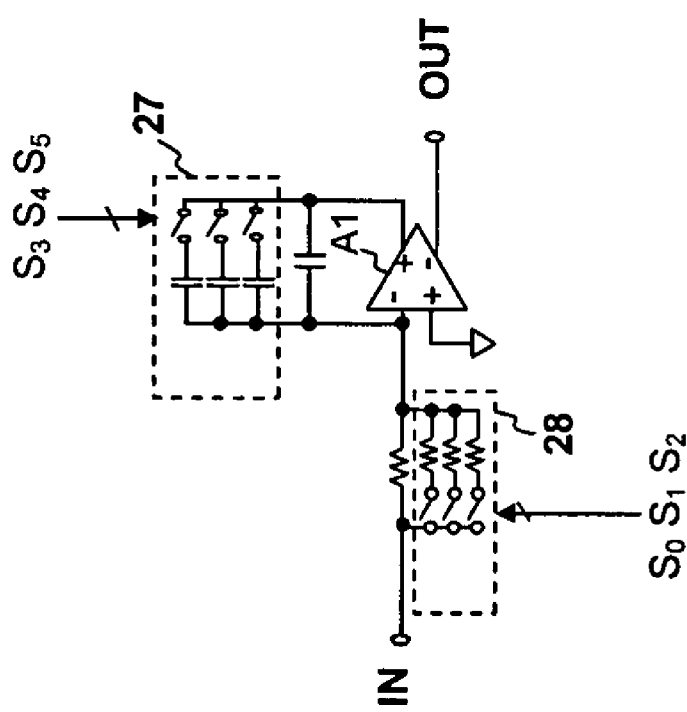

Referring now to FIG. 2A, one embodiment of an adjustable integrator 11 as may be used in the circuit of FIG. 1 is shown. The integrator depicted in FIG. 2A is implemented with a fully-differential amplifier A1 having an integrator constant set by a programmable feedback capacitance 27 responsive to digital control signals $S_3$–$S_5$ and a programmable input resistance 28 responsive to digital control signals $S_0$–$S_2$. Control signals $S_0$–$S_6$ are provided from control circuit 21 as determined by the NTF phase measurement described above.

Referring now to FIG. 2B, another embodiment of an adjustable integrator 11 as may be used in the circuit of FIG. 1 is shown. The integrator depicted in FIG. 2B is a switched-capacitor integrator also having an integrator constant set by a programmable feedback capacitance 27C responsive to digital control signals $S_3$–$S_5$ and a switched programmable input capacitance 27B responsive to digital control signals $S_0$–$S_2$ and is implemented with a fully differential amplifier A1. The input capacitance is switched by the Clock signal to provide an effective RC integrator as well-known in the art. As an alternative, or in combination, the frequency of the Clock signal can be varied to control the effective resistance of the switched input capacitance.

Figure 3B:
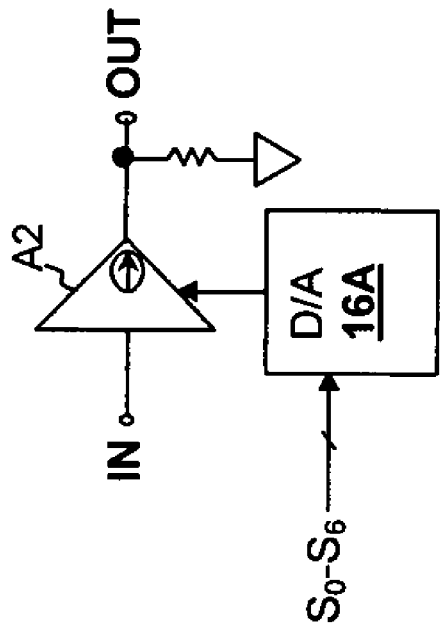
FIGS. 3A and 3B are schematic diagrams depicting embodiments of adjustable gain amplifier 12A of FIG. 1.
Figure 3A:
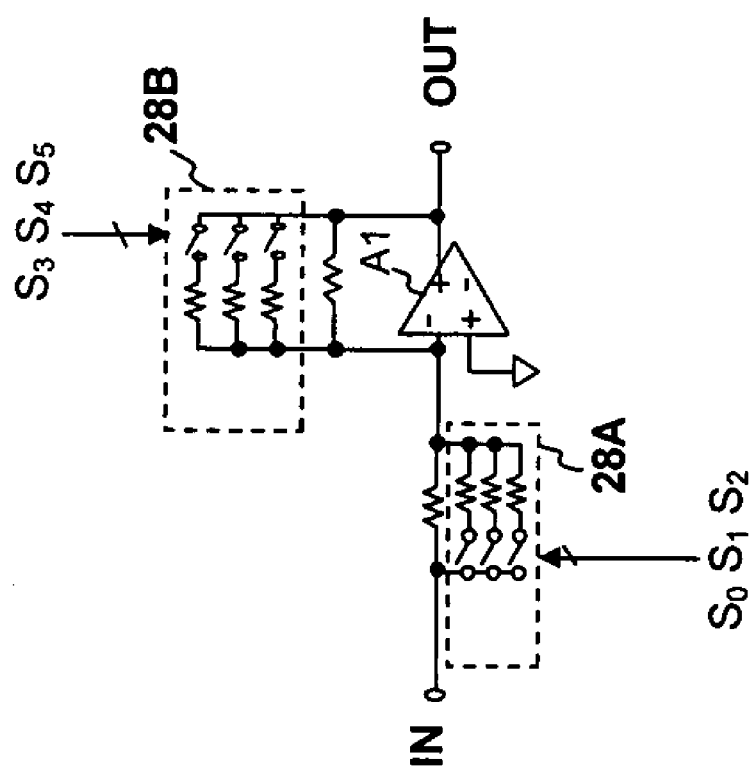

Referring now to FIG. 3A, one embodiment of an adjustable gain amplifier 12A as may be used in the circuit of FIG. 1 is shown. The amplifier depicted in FIG. 3A is implemented with a fully-differential amplifier A1 having a gain constant set by a programmable feedback resistance 28B responsive to digital control signals $S_3$–$S_5$ and a programmable input resistance 28A responsive to digital control signals $S_0$–$S_2$. Control signals $S_0$–$S_6$ are provided from control circuit 21 as determined by the NTF phase measurement described above, but are not necessarily the same control signals used to control programmable integrators 11 if both programmable integrators 11 and an adjustable gain amplifier 12A are used to implement the present invention, as the choice of using the same control signals will be based on a particular design and whether the logic for setting a particular switch is identical with that for another setting another switch. FIG. 3B shows an alternative programmable gain amplifier 12A that employs an adjustable gain amplifier A2, such as an operational transconductance amplifier having a gain set by an analog voltage (or current) supplied by a DAC 16, which may be implemented by a current-sinking resistor ladder as is well-known in the art.

Referring now to FIG. 4, the NTF of delta-sigma modulator 10 is shown as an amplitude 30 and phase 32 response. The amplitude of the NTF follows a typical third-order shape, with an in-band quantization noise suppression of more than 60 dB and rising above a 0 dB reference for frequencies exceeding the NTF zero frequency $F_z$. Point 34 illustrates an undesired position of the NTF zero, while point 36 illustrates a desired position of the NTF zero. If the uncalibrated position of the NTF zero starts at point 34 (response shape not shown for this position), then the phase of the NTF response as provided by phase detector 24 will be close to 90 degrees positive phase. Control circuit 21 then adjusts the gain of adjustable gain amplifier 12A downward via the adjusting scheme described above, or otherwise adjusts coefficients of delta-sigma modulator via raising the gain of programmable integrators 11, decreasing the gain of DAC 16 or any other mechanism for tuning the modulator coefficients until the measured phase changes sign. If the starting point had negative measured phase, the gain of adjustable gain amplifier 12A would be adjusted upward with similar opposite adjustments to any other adjusting devices. Alternatively, or in combination, the step adjustment can be made in conformity with a measured magnitude of the phase, providing either a single estimated correction, or speeding the convergence to near zero phase.

Figure 5:
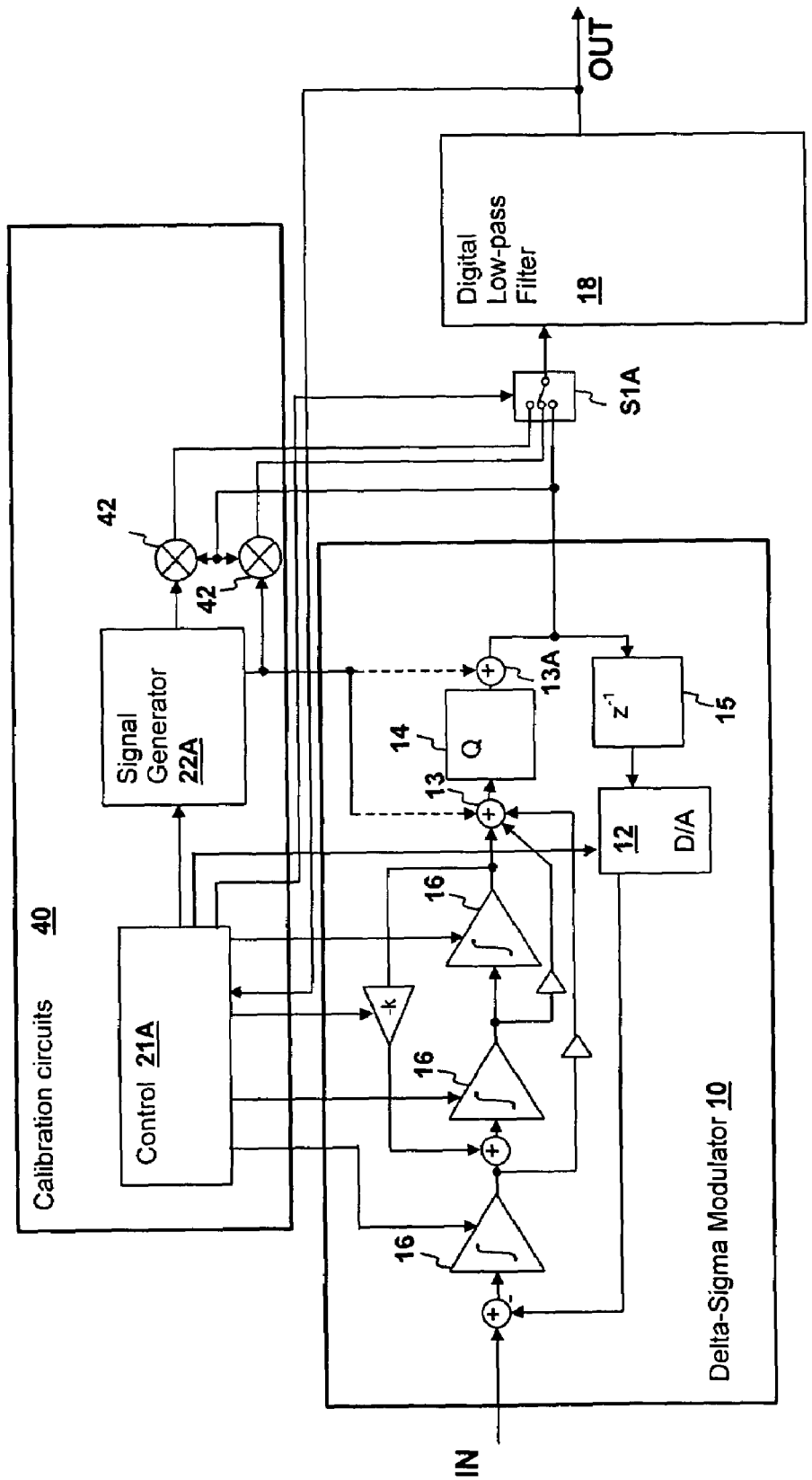
FIG. 5 is a block diagram depicting an apparatus in accordance with another embodiment of the present invention.

Referring now to FIG. 5, a circuit in accordance with another embodiment of the present invention is depicted. The circuit of FIG. 5 is similar to that of FIG. 1, so only differences between them will be described below. The phase detection in calibration circuits 40 is performed by a pair of multipliers 42 (mixers) forming a quadrature demultiplexer. Signal generator 22A provides a pair of quadrature outputs to supply one input of multipliers 42, which demodulate the output of delta-sigma modulator 10. Switch S1A selects between the output of delta-sigma modulator 10 in operational mode or one of the outputs of multipliers 42 when calibration control circuit 21A has initiated calibration mode. Calibration control circuit 21A and switch S1A selectively and successively apply the quadrature outputs of multipliers 42 to digital low-pass filter 18 in order to provide a pair of substantially DC values whose ratio is indicative of the phase of the NTF of delta-sigma modulator. The arctangent of the ratio gives the actual phase, but in general calibration control circuit 21A is seeking the sign change as described for the circuit of FIG. 1, which also occurs when the ratio passes through zero. Control circuit 21A adjusts one or more coefficients of delta-sigma modulator 10 as described above for the circuit of FIG. 1, via the various programmable elements in the loop of modulator 10.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A method for calibrating a delta-sigma modulator, said method comprising:
   generating a signal having a frequency in approximation of a frequency of a zero of a noise transfer function of said delta-sigma modulator;
   injecting said signal into a feedback loop of said delta-sigma modulator from a signal generator within said integrated circuit;
   detecting a response of said delta-sigma modulator to said injected signal over a number of samples; and
   adjusting at least one coefficient of said delta-sigma modulator to position said zero of said noise transfer function in conformity with a detected phase of said response.

2. The method of claim 1, further comprising filtering an output of a quantizer of said delta-sigma modulator with a narrow-band filter having a center frequency substantially equal to that of said generated signal and wherein said detecting detects a result of said filtering.

3. The method of claim 1, wherein said detecting detects a phase of said response of said delta-sigma modulator to said injected signal.

4. The method of claim 3, wherein said generated signal has a frequency that is an integer sub-multiple of a sampling frequency of said delta-sigma modulator, and wherein said detecting comprises:
   demodulating an output of said delta-sigma modulator with said generated signal;
   low pass filtering a result of said demodulating; and
   determining a phase of a result of said low pass filtering.

5. The method of claim 4, wherein said demodulating is performed by a pair of demodulators having quadrature inputs at a same frequency as said generated signal, wherein said low pass filtering is performed on an output of each of said demodulators and wherein said determining is performed by comparing dc levels of results of filtering each of said outputs of said demodulators.

6. The method of claim 3, wherein said frequency of said generated signal is substantially equal to a desired position of said zero, and wherein said adjusting is performed repeatedly after repeating said generating, injecting and detecting until said detecting detects a change in polarity of said detected phase.

7. The method of claim 3, further comprising estimating a deviation in said noise transfer function of said delta-sigma modulator in conformity with a magnitude and sign of said detected phase, and wherein said adjusting adjusts said gain of said delta-sigma modulator in conformity with a result of said estimating.

8. The method of claim 1, wherein said injecting injects said signal into an input of a quantizer of said delta-sigma modulator.

9. The method of claim 1, wherein said injecting combines said signal with an output of a quantizer of said delta-sigma modulator.

10. The method of claim 1, further comprising receiving an indication to initialize said delta-sigma modulator and wherein said generating, injecting, detecting and adjusting are performed in response to said receiving.

11. A circuit, comprising:
a delta-sigma modulator having at least one adjustable coefficient;
a signal generator having an output coupled to a feedback loop of said delta-sigma modulator for generating an output frequency in approximation of a zero of a noise-transfer function of said delta-sigma modulator;
a phase measurement circuit for detecting a response of said delta-sigma modulator to said output of said signal generator; and
a circuit for adjusting said at least one adjustable coefficient in conformity with an output of said phase measurement circuit.

12. The circuit of claim 11, further comprising a narrowband filter having a center frequency substantially equal to said signal generator output frequency, said filter having an input coupled to an output of said delta-sigma modulator and an output coupled to an input of said phase measurement circuit.

13. The circuit of claim 11, wherein said phase measurement circuit is a phase detector.

14. The circuit of claim 13, wherein said signal generator output frequency is an integer sub-multiple of a sampling frequency of said delta-sigma modulator, and wherein said phase detector comprises:
a demodulator for demodulating an output of said delta-sigma modulator by said signal generator output frequency; and
a low pass filter for filtering an output of said demodulator, and wherein said phase detector detects a phase of an output of said low pass filter.

15. The circuit of claim 14, wherein said demodulator is a quadrature demodulator, wherein said low pass filter comprises a pair of low pass filters, one for filtering each output of said quadrature demodulator and wherein said phase detector compares dc levels of outputs of said quadrature demodulator.

16. The circuit of claim 13, wherein said signal generator output frequency is substantially equal to a desired position of said zero, and wherein said adjusting circuit repeatedly adjust said at least one adjustable coefficient gain until said phase detector detects a change in polarity of said detected phase.

17. The circuit of claim 13, further comprising a circuit for estimating a deviation in said noise transfer function in conformity with a magnitude and sign of said detected phase, and wherein said adjusting circuit adjusts said at least one adjustable coefficient of said delta-sigma modulator in conformity with an output of said phase detector.

18. The circuit of claim 11, further comprising:
a calibration mode select input signal; and
a selector for selectively coupling said signal generator to said feedback loop of said delta-sigma modulator in response to assertion of said calibration mode select input signal.

19. The circuit of claim 11, wherein said output of signal generator is coupled to an input of a quantizer of said delta-sigma modulator.

20. The circuit of claim 11, wherein said output of said signal generator is combined with an output of a quantizer of said delta-sigma modulator and provided to said feedback loop.

* * * * *